United States Patent
Dorfman et al.

(10) Patent No.: US 9,779,851 B2
(45) Date of Patent: Oct. 3, 2017

(54) THERMOFORMABLE POLYMER THICK FILM TRANSPARENT CONDUCTOR WITH HAPTIC RESPONSE AND ITS USE IN CAPACITIVE SWITCH CIRCUITS

(71) Applicant: E I DU PONT DE NEMOURS AND COMPANY, Wilmington, DE (US)

(72) Inventors: Jay Robert Dorfman, Durham, NC (US); John D. Voultos, Raleigh, NC (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 13 days.

(21) Appl. No.: 14/660,356

(22) Filed: Mar. 17, 2015

(65) Prior Publication Data
US 2015/0279508 A1 Oct. 1, 2015

Related U.S. Application Data

(60) Provisional application No. 61/971,063, filed on Mar. 27, 2014.

(51) Int. Cl.
| | | |
|---|---|---|
| H01B 3/18 | (2006.01) | |
| H01B 1/20 | (2006.01) | |
| H03K 17/96 | (2006.01) | |
| B29C 45/14 | (2006.01) | |
| B29C 51/12 | (2006.01) | |
| C08L 71/00 | (2006.01) | |
| C08L 75/04 | (2006.01) | |
| H01B 1/22 | (2006.01) | |
| H05K 1/09 | (2006.01) | |
| B29K 75/00 | (2006.01) | |
| B29L 9/00 | (2006.01) | |
| H05K 1/16 | (2006.01) | |

(52) U.S. Cl.
CPC .......... *H01B 3/18* (2013.01); *B29C 45/14639* (2013.01); *B29C 51/12* (2013.01); *C08L 71/00* (2013.01); *C08L 75/04* (2013.01); *H01B 1/20* (2013.01); *H01B 1/22* (2013.01); *H05K 1/095* (2013.01); *B29K 2075/00* (2013.01); *B29L 2009/00* (2013.01); *H03K 17/962* (2013.01); *H03K 2217/96019* (2013.01); *H03K 2217/96062* (2013.01); *H03K 2217/960755* (2013.01); *H05K 1/16* (2013.01); *H05K 2201/0108* (2013.01); *H05K 2201/10151* (2013.01); *Y10T 428/31605* (2015.04); *Y10T 428/31609* (2015.04)

(58) Field of Classification Search
CPC ........ C08L 71/00; C08L 75/04; C08L 101/00; C08K 2003/2231; C08K 3/22; C08K 3/2279; B29C 45/14639; B29C 51/12; B29K 2075/00; B29L 2009/00; H01B 1/20; H01B 1/22; H01B 3/18; H03K 17/962; H03K 2217/96019; H03K 2217/96062; H03K 2217/960755; H05K 1/095; H05K 1/16; H05K 2201/0108; H05K 2201/10151; Y10T 428/31605; Y10T 428/31609

See application file for complete search history.

(56) References Cited

U.S. PATENT DOCUMENTS

| | | | |
|---|---|---|---|
| 8,692,131 B2 | 4/2014 | Dorfman et al. | |
| 9,245,666 B2 | 1/2016 | Dorfman et al. | |
| 9,553,254 B2 * | 1/2017 | Egron | H01L 41/29 |
| 2004/0009398 A1 | 1/2004 | Dorfman | |
| 2005/0121657 A1 | 6/2005 | Dorfman | |
| 2005/0236603 A1 | 10/2005 | Faris | |
| 2008/0311378 A1 * | 12/2008 | Simpson | C08J 9/0066 |
| | | | 428/319.1 |
| 2009/0169724 A1 | 7/2009 | Ogiwara | |
| 2012/0229882 A1 * | 9/2012 | Fish, Jr. | B60R 1/025 |
| | | | 359/267 |
| 2012/0327004 A1 * | 12/2012 | Mikladal | G06F 3/044 |
| | | | 345/173 |
| 2013/0069016 A1 * | 3/2013 | Dorfman | H01B 1/22 |
| | | | 252/514 |
| 2013/0206570 A1 | 8/2013 | Dorfman | |
| 2014/0037941 A1 | 2/2014 | Dorfman | |
| 2014/0198062 A1 * | 7/2014 | Kreutzer | G06F 1/1643 |
| | | | 345/173 |
| 2014/0295150 A1 * | 10/2014 | Bower | C09J 7/02 |
| | | | 428/201 |
| 2014/0354570 A1 * | 12/2014 | Makinen | G06F 3/041 |
| | | | 345/173 |
| 2015/0267068 A1 * | 9/2015 | Dorfman | C09D 11/52 |
| | | | 200/600 |

FOREIGN PATENT DOCUMENTS

WO 2013/095971 A1 6/2013

OTHER PUBLICATIONS (PCT/US2015/021483—International Search Report and Written Opinion dated Jun. 16, 2015.

* cited by examiner

Primary Examiner — Thao T Tran

(57) ABSTRACT

This invention is directed to a polymer thick film transparent conductive composition with haptic response capability that may be used in applications where thermoforming of the base substrate occurs, e.g., as in capacitive switches. Polycarbonate substrates are often used as the substrate and the polymer thick film conductive composition may be used without any barrier layer. Depending on the specific design, the thermoformable transparent conductor may be below or on top of a thermoformable silver conductor. Thermoformable electric circuits benefit from the presence of an encapsulant layer over the dried polymer thick film conductive composition. The electrical circuit is subsequently subjected to an injection molding process.

32 Claims, No Drawings

THERMOFORMABLE POLYMER THICK FILM TRANSPARENT CONDUCTOR WITH HAPTIC RESPONSE AND ITS USE IN CAPACITIVE SWITCH CIRCUITS

FIELD OF THE INVENTION

This invention is directed to polymer thick film transparent conductive compositions with haptic response that may be used in applications where thermoforming of the base substrate occurs. Polycarbonate substrates are often used and the conductor may be used without any barrier layer.

BACKGROUND OF THE INVENTION

Conductive polymer thick film (PTF) circuits have long been used as electrical elements. Although they have been used for years in these types of applications, the use of PTF silver conductors in thermoforming procedures is not common. This is particularly important in circuits where a highly conductive silver composition is needed after the severe thermoforming process. Additionally, the typical substrate used for thermoforming is polycarbonate and very often the conductor is not compatible with this substrate. One of the purposes of this invention is to alleviate these issues and produce a conductive, thermoformable construction in which a printed transparent conductor with haptic response can be used either on a substrate of choice such as a polycarbonate or as part of the capacitive circuit stack where it can be printed below or above silver. Another key purpose of this invention is to introduce haptic response into the transparent conductor. Haptic technology, or haptics, is a tactile feedback technology which takes advantage of the sense of touch by applying forces, vibrations, or motions to the user. Haptic devices may incorporate tactile sensors that measure forces exerted by the user on the interface.

SUMMARY OF THE INVENTION

This invention relates to a first polymer thick film transparent conductive composition with haptic response capability comprising:
(a) 10-70 wt % of a conductive oxide powder selected from the group consisting of indium tin oxide powder, antimony tin oxide powder and mixtures thereof;
(b) 10-50 wt % of a first organic medium comprising 10-50 wt % thermoplastic urethane resin dissolved in a first organic solvent, wherein the weight percent of the thermoplastic urethane resin is based on the total weight of the first organic medium;
(c) 10-50 wt % of a second organic medium comprising 10-50 wt % thermoplastic polyhydroxyether resin dissolved in a second organic solvent wherein the weight percent of the thermoplastic polyhydroxyether resin is based on the total weight of the second organic medium; and
(d) 10-50 wt % of a third organic medium comprising at least one electroactive polymer in a third organic solvent;
wherein the weight percent of the conductive filler, the first organic medium, the second organic medium and the third organic medium are based on the total weight of the polymer thick film conductive composition.
In an embodiment, the polymer thick film transparent conductive composition with haptic response further comprises:
(e) 1-20 wt % of a fourth organic solvent, wherein the fourth organic solvent is diacetone alcohol and wherein the weight percent is based on the total weight of the polymer thick film conductive composition.

This invention also relates to a second polymer thick film transparent conductive composition with haptic response comprising:
(a) 10-70 wt % of a conductive oxide powder selected from the group consisting of indium tin oxide powder, antimony tin oxide powder and mixtures thereof;
(b) 10-50 wt % of a first organic medium comprising 10-50 wt % thermoplastic urethane resin dissolved in a first organic solvent, wherein the weight percent of the thermoplastic urethane resin is based on the total weight of the first organic medium; and
(c) 10-50 wt % of a second organic medium comprising at least one electroactive polymer in a second organic solvent;
wherein the weight percent of the conductive filler, the first organic medium and the second organic medium are based on the total weight of the polymer thick film conductive composition.
In an embodiment, the polymer thick film transparent conductive composition with haptic response capability further comprises:
(d) 1-20 wt % of a third organic solvent, wherein the third organic solvent is diacetone alcohol and wherein the weight percent is based on the total weight of the polymer thick film conductive composition.
In one embodiment, the conductive oxide powder particles are in the form of flakes.
The invention is further directed to using the thermoformable conductive composition to form conductive electrical circuits for capacitive switches and, in particular, in the thermoforming of the total construction. In one embodiment an encapsulant layer is deposited over the dried PTF transparent conductor composition.

DETAILED DESCRIPTION OF INVENTION

The invention relates to a polymer thick transparent conductive composition for use in thermoforming electrical circuits and, in particular, capacitive switch circuits. A layer of conductor is printed and dried on a substrate so as to produce a functioning circuit and then the entire circuit is subjected to pressure and heat that deforms the circuit to its desired three dimensional characteristics, i.e., thermoforming.

The substrates commonly used in polymer thick film thermoformed circuits are polycarbonate (PC), PVC and others. PC is generally preferred since it can be thermoformed at higher temperatures. However, PC is very sensitive to the solvents used in the layers deposited on it.

The polymer thick film (PTF) conductive composition is comprised of (i) a conductive oxide powder selected from the group consisting of indium tin oxide (ITO) powder, antimony tin oxide (ATO) powder and mixtures thereof, (ii) a first organic medium comprising a first polymer resin dissolved in a first organic solvent, (iii) a second organic medium containing a second polymer resin dissolved in a second organic solvent and (iv) a third organic medium comprising one or more electroactive polymers in a third organic solvent.

In an embodiment that results in no crazing or deformation of the underlying substrate onto which the PTF transparent conductive composition is printed, the PTF conductive composition further comprises a fourth solvent, diacetone alcohol.

Additionally, powders and printing aids may be added to improve the composition.

The use of the term transparent is a relative one. Herein, transparent is meant to mean at least 30% light transmission through the printed/dried conductor.

Each constituent of the electrically conductive composition of the present invention is discussed in detail below.

A. Transparent Conductive Powder

The conductors in the present thick film composition are ITO powder, ATO powder, or mixtures thereof. Various particle diameters and shapes of the powder particles are contemplated. In an embodiment, the conductive powder particles may include any shape, including spherical particles, flakes, rods, cones, plates, and mixtures thereof. In one embodiment, the ITO is in the form of flakes.

In an embodiment, the particle size distribution of the ITO and ATO powders is 0.3 to 50 microns; in a further embodiment, 0.5-15 microns.

In an embodiment, the surface area/weight ratio of the conductive oxide powder particles is in the range of 1.0-100 $m^2/g$.

ITO is tin-doped indium oxide, $Sn:In_2O_3$, i.e., a solid solution of $In_2O_3$ and $SnO_2$ with typically 90 wt % $In_2O_3$ and 10 wt % $SnO_2$. ATO is antimony-doped tin oxide, $Sb:SnO_2$, i.e., a solid solution of $Sb_2O_3$ and $SnO_2$ with typically 10 wt % $Sb_2O_3$ and 90 wt % $SnO_2$.

Furthermore, it is known that small amounts of other metals may be added to transparent conductor compositions to improve the electrical properties of the conductor. Some examples of such metals include: gold, silver, copper, nickel, aluminum, platinum, palladium, molybdenum, tungsten, tantalum, tin, indium, lanthanum, gadolinium, boron, ruthenium, cobalt, titanium, yttrium, europium, gallium, sulfur, zinc, silicon, magnesium, barium, cerium, strontium, lead, antimony, conductive carbon, and combinations thereof and others common in the art of thick film compositions. The additional metal(s) may comprise up to about 1.0 percent by weight of the total composition. However, the degree of transparency may suffer as these metals are added.

In one embodiment, the conductive oxide powder is present at 20 to 70 wt %, based on the total weight of the PTF conductive composition. In another embodiment, it is present at 30 to 60 wt % and in still another embodiment, it is present at 35 to 55 wt %, again based on the total weight of the PTF conductive composition.

B. Organic Media

First Polymer Thick Film Transparent Conductive Composition with Haptic response The first organic medium is comprised of a thermoplastic urethane resin dissolved in a first organic solvent. The urethane resin must achieve good adhesion to the underlying substrate. It must be compatible with and not adversely affect the performance of the circuit after thermoforming.

In one embodiment the thermoplastic urethane resin is 10-50 wt % of the total weight of the first organic medium. In another embodiment the thermoplastic urethane resin is 15-45 wt % of the total weight of the first organic medium and in still another embodiment the thermoplastic urethane resin is 15-25 wt % of the total weight of the first organic medium. In one embodiment the thermoplastic urethane resin is a urethane homopolymer. In another embodiment the thermoplastic urethane resin is a polyester-based copolymer.

The second organic medium is comprised of a thermoplastic polyhydroxyether resin dissolved in a second organic solvent. It should be noted that the same solvent that is used in the first organic medium can be used in the second organic medium or a different solvent could be used. The solvent must be compatible with and not adversely affect the performance of the circuit after thermoforming. In one embodiment the thermoplastic polyhydroxyether resin is 10-50 wt % of the total weight of the second organic medium. In another embodiment the thermoplastic polyhydroxyether resin is 15-45 wt % of the total weight of the second organic medium and in still another embodiment the thermoplastic resin is 20-30 wt % of the total weight of the second organic medium.

The third organic medium contains at least one electroactive polymer (EAP) which provides the haptic response for the circuit. The type of EAP may be either dielectric or ionic. Examples of both are available in the literature. The third organic solvent must be compatible with the EAP. In one embodiment the EAP is 10-50 wt % of the total weight of the third organic medium. In another embodiment the EAP is 15-45 wt % of the total weight of the third organic medium and in still another embodiment the EAP is 15-25 wt % of the total weight of the third organic medium.

The polymer resin is typically added to the organic solvent by mechanical mixing to form the medium. Solvents suitable for use in the organic media of the polymer thick film conductive composition are recognized by one of skill in the art and include acetates and terpenes such as carbitol acetate and alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate may be included. In many embodiments of the present invention, solvents such as glycol ethers, ketones, esters and other solvents of like boiling points (in the range of 180° C. to 250° C.), and mixtures thereof may be used. Various combinations of these and other solvents are formulated to obtain the viscosity and volatility requirements desired. The solvents used must solubilize the resin.

Second Polymer Thick Film Transparent Conductive Composition with Haptic Response The first organic medium is comprised of a thermoplastic urethane resin dissolved in a first organic solvent. The urethane resin must achieve good adhesion to the underlying substrate. It must be compatible with and not adversely affect the performance of the circuit after thermoforming.

In one embodiment the thermoplastic urethane resin is 10-50 wt % of the total weight of the first organic medium. In another embodiment the thermoplastic urethane resin is 15-45 wt % of the total weight of the first organic medium and in still another embodiment the thermoplastic urethane resin is 15-25 wt % of the total weight of the first organic medium. In one embodiment the thermoplastic urethane resin is a urethane homopolymer. In another embodiment the thermoplastic urethane resin is a polyester-based copolymer.

The second organic medium contains at least one electroactive polymer (EAP) which provides the haptic response for the circuit. The type of EAP may be either dielectric or ionic. Examples of both are available in the literature. The second organic solvent must be compatible with the EAP. In one embodiment the EAP is 10-50 wt % of the total weight of the third organic medium. In another embodiment the EAP is 15-45 wt % of the total weight of the third organic medium and in still another embodiment the EAP is 15-25 wt % of the total weight of the third organic medium.

The polymer resin is typically added to the organic solvent by mechanical mixing to form the medium. Solvents suitable for use in the organic media of the polymer thick film conductive composition are recognized by one of skill in the art and include acetates and terpenes such as carbitol acetate and alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate may be included. In many embodiments of the present invention, solvents such as glycol ethers, ketones, esters and other solvents of like boiling points (in the range of 180° C. to 250° C.), and mixtures thereof may be used. Various combinations of these and other solvents are formulated to obtain the viscosity and volatility requirements desired. The solvents used must solubilize the resin.

Additional Organic Solvent

In other embodiments, the first and second polymer thick film transparent conductive compositions further comprise another organic solvent, diacetone alcohol. In an embodiment the diacetone alcohol is 1-20 wt % of the total weight of the PTF conductive composition. In another embodiment the diacetone alcohol is 3-12 wt % of the total weight of the PTF conductive composition and in still another embodiment the diacetone alcohol is 4-6 wt % of the total weight of the PTF conductive composition.

Additional Powders

Various powders may be added to the PTF conductor composition to improve adhesion, modify the rheology and increase the low shear viscosity thereby improving the printability.

Application of the PTF Conductor Composition

The PTF conductor, also referred to as a "paste", is typically deposited on a substrate, such as polycarbonate, that is impermeable to gases and moisture. The substrate can also be a sheet of a composite material made up of a combination of plastic sheet with optional metallic or dielectric layers deposited thereupon. The transparent conductor may also be deposited on top of a thermoformable Ag conductor such as DuPont 5042 or 5043 (Du Pont Co., Wilmington, Del.), or a thermoformable dielectric layer. Alternatively, a thermoformable Ag conductor may be formed on top of the transparent conductor.

The deposition of the PTF conductor composition is performed typically by screen printing, but other deposition techniques such as stencil printing, syringe dispensing or coating techniques can be utilized. In the case of screen-printing, the screen mesh size controls the thickness of the deposited thick film.

Generally, a thick film composition comprises a functional phase that imparts appropriate electrically functional properties to the composition. The functional phase comprises electrically functional powders dispersed in an organic medium that acts as a carrier for the functional phase. Generally, the composition is fired to burn out both the polymer and the solvent of the organic medium and to impart the electrically functional properties. However, in the case of a polymer thick film, the polymer portion of the organic medium remains as an integral part of the composition after drying and, therefore, is an integral part of the resultant conductor.

The PTF conductor composition is processed for a time and at a temperature necessary to remove all solvent. For example, the deposited thick film is dried by exposure to heat at 130° C. for typically 10-15 min.

Circuit Construction

For a capacitive switch circuit the base substrate used is typically 10 mil thick polycarbonate. The conductor composition is printed and dried as per the conditions described above. Several layers can be printed and dried. Subsequent steps may include thermoforming (190° C., 750 psi) of the entire unit as is typical in the production of 3D capacitive switch circuits. In one embodiment an encapsulant layer is deposited over the dried PTF conductive composition, i.e., the transparent conductor, and then dried.

In an embodiment when the first PTF transparent conductive composition with haptic response capability is used to form a transparent conductor, the encapsulant is comprised of the same organic mediums as contained in the PTF conductive composition, i.e., the same polymers in the same ratios as present in the first and second organic mediums of the PTF conductive composition. In another such embodiment, the encapsulant is comprised of the same organic mediums as contained in the PTF conductive composition, i.e., the same polymers, but in different ratios than present in the first and second organic mediums of the PTF conductive composition.

In an embodiment when the second PTF transparent conductive composition with haptic response capability is used, the encapsulant is comprised of the same organic medium as contained in the PTF conductive composition, i.e., the same polymer as present in the first organic medium of the PTF conductive composition.

In another embodiment, an encapsulant layer is deposited over the dried PTF conductive composition and then UV-cured. In this embodiment the encapsulant is comprised of one or more UV-curable polymers, e.g., acrylate-based polymers. One PTF UV-curable composition suitable for forming an encapsulant layer is comprised of a high elongation urethane oligomer, an acrylate monomer, an acrylated amine and an inorganic powder.

It has been found that use of an encapsulant improves the yield, i.e., decreases the failure rate of thermoformed circuits.

In the course of producing a 3-dimensional capacitive circuit, after the thermoforming step, the final step will often be a molding step in which the finished circuit is formed by injection molding using a resin such as polycarbonate. This process is referred to as in-molding and involves higher temperatures. Depending on the resin chosen, these temperatures can typically exceed 250° C. for 10-30 sec. Thus the choice of the resins used in the PTF composition is critical. The combination of the resins used in the instant PTF composition has been shown to survive the in-mold process and produce fully functional circuitry whereas most resins typically used in PTF compositions will not.

What is claimed is:

1. A polymer thick film transparent conductive composition with haptic response capability comprising:
   (a) 10-70 wt % of a conductive oxide powder selected from the group consisting of indium tin oxide powder, antimony tin oxide powder and mixtures thereof;
   (b) 10-50 wt % of a first organic medium comprising 10-50 wt % thermoplastic urethane resin dissolved in a first organic solvent, wherein the weight percent of the thermoplastic urethane resin is based on the total weight of the first organic medium;
   (c) 10-50 wt % of a second organic medium comprising 10-50 wt % thermoplastic polyhydroxyether resin dissolved in a second organic solvent wherein the weight percent of the thermoplastic polyhydroxyether resin is based on the total weight of the second organic medium; and (d) 10-50 wt % of a third organic medium comprising at least one electroactive polymer that provides haptic response capability in a third organic solvent;
wherein the weight percent of said conductive filler, said first organic medium, said second organic medium and said third organic medium are based on the total weight of said polymer thick film conductive composition.

2. The polymer thick film transparent conductive composition of claim 1, further comprising
(e) 1-20 wt % of a fourth organic solvent, wherein the fourth organic solvent is diacetone alcohol and wherein the weight percent is based on the total weight of said polymer thick film conductive composition.

3. A polymer thick film transparent conductive composition with haptic response capability comprising:
(a) 10-70 wt % of a conductive oxide powder selected from the group consisting of indium tin oxide powder, antimony tin oxide powder and mixtures thereof;
(b) 10-50 wt % of a first organic medium comprising 10-50 wt % thermoplastic urethane resin dissolved in a first organic solvent, wherein the weight percent of the thermoplastic urethane resin is based on the total weight of the first organic medium; and
(c) 10-50 wt % of a second organic medium comprising at least one electroactive polymer that provides haptic response capability in a second organic solvent;
wherein the weight percent of said conductive filler, said first organic medium and said second organic medium are based on the total weight of said polymer thick film conductive composition.

4. The polymer thick film transparent conductive composition of claim 3, further comprising
(d) 1-20 wt % of a third organic solvent, wherein the third organic solvent is diacetone alcohol and wherein the weight percent is based on the total weight of said polymer thick film conductive composition.

5. An electrical circuit comprising a transparent conductor with haptic response formed from a polymer thick film conductive composition with haptic response capability comprising:
(a) 10-70 wt % of a conductive oxide powder selected from the group consisting of indium tin oxide powder, antimony tin oxide powder and mixtures thereof;
(b) 10-50 wt % of a first organic medium comprising 10-50 wt % thermoplastic urethane resin dissolved in a first organic solvent, wherein the weight percent of the thermoplastic urethane resin is based on the total weight of the first organic medium;
(c) 10-50 wt % of a second organic medium comprising 10-50 wt % thermoplastic polyhydroxyether resin dissolved in a second organic solvent wherein the weight percent of the thermoplastic polyhydroxyether resin is based on the total weight of the second organic medium; and
(d) 10-50 wt % of a third organic medium comprising at least one electroactive polymer that provides haptic response capability in a third organic solvent;
wherein the weight percent of said conductive oxide powder, said first organic medium, said second organic medium and said third organic medium are based on the total weight of said polymer thick film conductive composition and wherein said polymer thick film conductive composition is dried to form said transparent conductor.

6. The electrical circuit of claim 5, said polymer thick film conductive composition further comprising
(e) 1-20 wt % of a fourth organic solvent, wherein the fourth organic solvent is diacetone alcohol and wherein the weight percent is based on the total weight of said polymer thick film conductive composition.

7. The electrical circuit of claim 5, wherein said electrical circuit is thermoformed.

8. The electrical circuit of claim 6, wherein said electrical circuit is thermoformed.

9. The electrical circuit of claim 7, wherein said electrical circuit is subjected to an injection molding process subsequent to being thermoformed.

10. The electrical circuit of claim 8, wherein said electrical circuit is subjected to an injection molding process subsequent to being thermoformed.

11. The electrical circuit of claim 6, further comprising an encapsulant layer.

12. The electrical circuit of claim 11, wherein said encapsulant layer is selected from the group consisting of (i) a dried encapsulant layer comprising the same polymers in the same ratios as present in said first and second organic mediums of the polymer thick film conductive composition in the same ratio or in different ratios, wherein said polymer thick film conductive composition is dried before said encapsulant layer is deposited and dried and (ii) a UV-cured encapsulant layer comprising one or more UV-curable polymers, wherein said polymer thick film conductive composition is dried before said encapsulant layer is deposited and UV-cured.

13. The electrical circuit of claim 6, further comprising a thermoformable silver conductor, wherein said transparent conductor has been formed on said thermoformable silver conductor or wherein, following the drying of said polymer thick film conductive composition to form said transparent conductor, said thermoformable silver conductor is formed on top of said transparent conductor.

14. The electrical circuit of claim 12, further comprising a thermoformable silver conductor, wherein said transparent conductor has been formed on said thermoformable silver conductor and said encapsulant layer is deposited on said transparent conductor, or wherein, following the drying of said polymer thick film conductive composition to form said transparent conductor, said thermoformable silver conductor is formed on top of the transparent conductor before said encapsulant layer is deposited on said thermoformable silver conductor.

15. The electrical circuit of claim 12, wherein said electrical circuit is thermoformed.

16. The electrical circuit of claim 14, wherein said electrical circuit is thermoformed.

17. The electrical circuit of claim 15, wherein said electrical circuit is subjected to an injection molding process subsequent to being thermoformed.

18. The electrical circuit of claim 16, wherein said electrical circuit is subjected to an injection molding process subsequent to being thermoformed.

19. An electrical circuit comprising a transparent conductor with haptic response formed from a polymer thick film conductive composition with haptic response capability comprising:
(a) 10-70 wt % of a conductive oxide powder selected from the group consisting of indium tin oxide powder, antimony tin oxide powder and mixtures thereof;
(b) 10-50 wt % of a first organic medium comprising 10-50 wt % thermoplastic urethane resin dissolved in a first organic solvent, wherein the weight percent of the thermoplastic urethane resin is based on the total weight of the first organic medium; and (c) 10-50 wt % of a second organic medium comprising at least one electroactive polymer that provides haptic response capability in a second organic solvent;

wherein the weight percent of said conductive filler, said first organic medium and said second organic medium are based on the total weight of said polymer thick film conductive composition and wherein said polymer thick film conductive composition is dried to form said transparent conductor.

20. The electrical circuit of claim 19, said polymer thick film conductive composition further comprising
    (d) 1-20 wt % of a third organic solvent, wherein the third organic solvent is diacetone alcohol and wherein the weight percent is based on the total weight of said polymer thick film conductive composition.

21. The electrical circuit of claim 19, wherein said electrical circuit is thermoformed.

22. The electrical circuit of claim 20, wherein said electrical circuit is thermoformed.

23. The electrical circuit of claim 21, wherein said electrical circuit is subjected to an injection molding process subsequent to being thermoformed.

24. The electrical circuit of claim 22, wherein said electrical circuit is subjected to an injection molding process subsequent to being thermoformed.

25. The electrical circuit of claim 20, further comprising an encapsulant layer.

26. The electrical circuit of claim 25, wherein said encapsulant layer is selected from the group consisting of (i) a dried encapsulant layer comprising the same polymer present in said in first organic medium of the polymer thick film conductive composition polymer thick film conductive composition, wherein said polymer thick film conductive composition is dried before said encapsulant layer is deposited and dried and (ii) a UV-cured encapsulant layer comprising one or more UV-curable polymers, wherein said polymer thick film conductive composition is dried before said encapsulant layer is deposited and UV-cured.

27. The electrical circuit of claim 20, further comprising a thermoformable silver conductor, wherein said transparent conductor has been formed on said thermoformable silver conductor or wherein, following the drying of said polymer thick film conductive composition to form said transparent conductor, said thermoformable silver conductor is formed on top of said transparent conductor.

28. The electrical circuit of claim 26, further comprising a thermoformable silver conductor, wherein said transparent conductor has been formed on said thermoformable silver conductor and said encapsulant layer is deposited on said transparent conductor, or wherein, following the drying of said polymer thick film conductive composition to form said transparent conductor, said thermoformable silver conductor is formed on top of the transparent conductor before said encapsulant layer is deposited on said thermoformable silver conductor.

29. The electrical circuit of claim 26, wherein said electrical circuit is thermoformed.

30. The electrical circuit of claim 28, wherein said electrical circuit is thermoformed.

31. The electrical circuit of claim 29, wherein said electrical circuit is subjected to an injection molding process subsequent to being thermoformed.

32. The electrical circuit of claim 30, wherein said electrical circuit is subjected to an injection molding process subsequent to being thermoformed.

* * * * *